(12) United States Patent
Chen et al.

(10) Patent No.: US 11,404,499 B2
(45) Date of Patent: Aug. 2, 2022

(54) OLED TOUCH AND DISPLAY DRIVER INTEGRATION CHIP AND OLED TOUCH DISPLAY APPARATUS INCLUDING THEREOF

(71) Applicant: NOVATEK MICROELECTRONICS CORP., Taiwan (CN)

(72) Inventors: Chang-Hung Chen, Zhubei (TW); Kun-Zheng Lin, Hsinchu (TW); Wei-Chieh Lin, Zhubei (TW); Po-Sheng Liao, Hsinchu (TW); Yu-Huang Chen, Tainan (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/327,300

(22) Filed: May 21, 2021

(65) Prior Publication Data
US 2021/0367001 A1     Nov. 25, 2021

Related U.S. Application Data

(60) Provisional application No. 63/059,189, filed on Jul. 31, 2020, provisional application No. 63/028,573, filed on May 22, 2020.

(51) Int. Cl.
*H01L 27/32* (2006.01)
*G06F 3/044* (2006.01)
*G06F 3/041* (2006.01)

(52) U.S. Cl.
CPC .......... *H01L 27/323* (2013.01); *G06F 3/0412* (2013.01); *G06F 3/0445* (2019.05)

(58) Field of Classification Search
CPC ......... H01L 27/323; H01L 27/32–3293; G06F 3/041–047; G06F 2203/041–04114; G06F 3/04164; G06F 3/04107
See application file for complete search history.

(56) References Cited

FOREIGN PATENT DOCUMENTS

| CN | 101968701 A | 2/2011 |
|---|---|---|
| CN | 107239172 A | 10/2017 |
| CN | 111381719 A | 7/2020 |

*Primary Examiner* — Sanjiv D. Patel
(74) *Attorney, Agent, or Firm* — Marshall, Gerstein & Borun LLP

(57) ABSTRACT

An OLED touch and display driver integration chip is provided, including: at least one group of display driving pads for providing display driving signals to the OLED touch display panel; at least one group of touch pads for providing touch driving signals to touch electrodes on the OLED touch display panel, and alternately arranged in groups with the at least one group of display driving pads; at least one group of isolation pads, each group of isolation pads includes at least one isolation pad and is arranged between a group of display driving pads and a group of touch pads that are adjacent, an isolation pad is configured to apply a specific signal to isolate signal interference between adjacent groups of display driving pads and touch pads, or configured to apply a specific signal or be in a floating state, to reduce load of data lines or the touch electrodes.

48 Claims, 9 Drawing Sheets

OLED TOUCH AND DISPLAY DRIVER INTEGRATION CHIP AND OLED TOUCH DISPLAY APPARATUS INCLUDING THEREOF

CROSS REFERENCE TO RELATED APPLICATIONS

This application claims priority to U.S. Provisional Application No. 63/028,573 filed on May 22, 2020 and U.S. Provisional Application No. 63/059,189 filed on Jul. 31, 2020, which are incorporated herein by reference in their entirety.

TECHNICAL FIELD

This application relates to a field of touch and display technology, and in particular, to an OLED touch and display driver integration chip, and an OLED touch display apparatus including the OLED touch and display driver integration chip.

BACKGROUND

It is known that, by using Touch and Display Driver Integration (TDDI) technologies, a touch chip and a display chip may be integrated as a single touch and display driver integration chip (i.e., a TDDI chip), so as to improve integration of a touch display apparatus.

A traditional LCD TDDI chip has only a small number of display driving pads and touch pads that are alternately arranged in groups, and since the traditional chip adopts time division driving manner of display and touch, there will be no interference between a group of display driving pads and a group of touch pads that are adjacent. A future OLED TDDI chip will still adopt a structure in which display driving pads and touch pads are alternately arranged in groups. However, in order to avoid the occurrence of the problem of display bright and dark bands, the OLED TDDI chip will not adopt the time division driving manner, and a display operation period and a touch operation period will at least partially overlap. In this case, there will be mutual interference (including the interference on the chip and the interference on the fanout area where pad lead wires are located) between a group of display driving pads and a group of touch pads that are adjacent, which finally leads to reduced Signal-to-Noise Ratio (SNR) of touch signals in terms of touching, and appearance of multi-band phenomenon in terms of displaying due to deviation of the pixel voltage from an expected target voltage caused by touching signals being coupled to driving pads.

In addition, there is a coupling capacitance between a touch pad lead wire and a display driving pad lead wire that are adjacent in the fanout area, which leads to a large load on corresponding touch electrodes and data line.

Therefore, there is a need for a new type of OLED touch and display driver integration chip to reduce interference between a group of display driving pads and a group of touch pads that are adjacent, and to reduce the large load caused by the coupling capacitance between lead wires.

SUMMARY OF THE DISCLOSURE

To this end, the present disclosure proposes an OLED touch and display driver integration chip and an OLED touch display apparatus including the OLED touch and display driver integration chip.

According to one aspect of the present disclosure, there is provided an OLED touch and display driver integration chip for driving an OLED touch display panel. The OLED touch and display driver integration chip comprising: at least one group of display driving pads for providing display driving signals to the OLED touch display panel; at least one group of touch pads for providing touch driving signals to touch electrodes on the OLED touch display panel, and alternately arranged in groups with the at least one group of display driving pads; and at least one group of isolation pads, wherein each group of isolation pads includes at least one isolation pad and is arranged between a group of display driving pads and a group of touch pads that are adjacent, and an isolation pad of the at least one group of isolation pads is configured to apply a specific signal to isolate signal interference between the group of display driving pads and the group of touch pads that are adjacent.

According to another aspect of the present disclosure, there is provided another OLED touch and display driver integration chip for driving an OLED touch display panel. The OLED touch and display driver integration chip comprising: at least one group of display driving pads for providing display driving signals to the OLED touch display panel; at least one group of touch pads for providing touch driving signals to touch electrodes on the OLED touch display panel, and alternately arranged in groups with the at least one group of display driving pads; and at least one group of isolation pads, wherein each group of isolation pads includes at least one isolation pad and is arranged between a group of display driving pads and a group of touch pads that are adjacent, and an isolation pad of the at least one group of isolation pads is configured to apply a specific signal or be in a floating state, to reduce load of data lines of the OLED touch display panel to which the group of display driving pads are coupled, or load of the touch electrodes on the OLED touch display panel to which the group of touch pads are coupled.

According to yet another aspect of the present disclosure, there is provided an OLED touch display apparatus, comprising the above-mentioned OLED touch and display driver integration chip, or another OLED touch and display driver integration chip, and a OLED touch display panel coupled to the OLED touch and display driver integration chip.

In order to make the above features and advantages of the present disclosure more comprehensible, embodiments are presented below and are described in detail in connection with accompanying drawings.

BRIEF DESCRIPTION OF THE DRAWINGS

The accompanying drawings are used to provide a further understanding of the embodiments of the present disclosure, which constitute a part of the specification, and explain the present disclosure together with the embodiments of the present disclosure, but do not constitute a limitation to the present disclosure. In the accompanying drawings, the same reference numerals usually represent the same components or steps.

DESCRIPTION OF THE EMBODIMENTS

Figure 1:
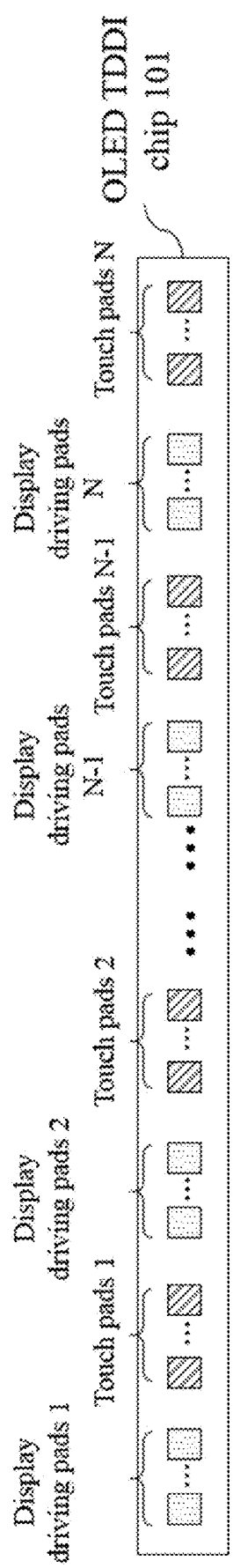
FIG. 1 shows a schematic diagram of a pad arrangement on an OLED TDDI chip in the prior art.

The terms "first", "second" and the like referenced throughout the specification of the present disclosure (including the claims) are used to name elements, or to distinguish different embodiments or scopes, rather than to limit an upper or lower limit of the number of the elements, or to limit an order of the elements. In addition, wherever possible, elements/members/steps with the same reference numerals in the accompanying drawings and the embodiments represent the same or similar parts. Elements/members/steps using the same reference numerals or using the same terms in different embodiments may refer to related descriptions.

First, a pad arrangement of an OLED touch and display driver integration (TDDI) chip for reducing interference according to the embodiments of the present disclosure will be introduced.

According to the embodiments of the present disclosure, under the current architecture in which display driving pads and touch pads are alternately arranged in groups on an OLED TDDI chip, by adding an isolation pad between a group of display driving pads and a group of touch pads that are adjacent, and using the isolation pad to apply a specific signal to a lead wire to which it is connected, interference between the group of display driving pads and the group of touch pads that are adjacent is reduced.

FIG. 1 shows a schematic diagram of a pad arrangement on an OLED TDDI chip in the prior art. As shown in FIG. 1, an OLED TDDI chip 101 includes at least one group of display driving pads 1-N and at least one group of touch pads 1-N that are alternately arranged in groups, where display driving pads 1 are a group of display driving pads, touch pads 1 are a group of touch pads arranged adjacent to the display driving pads 1, and so on, a total of N groups of display driving pads and N groups of touch pads are shown in the figure. However, the present disclosure does not limit the number of the display driving pad groups and the touch pad groups arranged on the OLED TDDI chip, nor does it limit the number of pads in respective pad groups.

Each display driving pad in FIG. 1 may be coupled to a data line on the OLED touch display panel, and provide a display driving signal to a capacitor of a corresponding display pixel via the data line to charge the capacitor, thereby driving the OLED to emit light. Each touch pad in FIG. 1 may provide a touch driving signal to a touch electrode on the OLED touch display panel. As shown in FIG. 1, due to the architecture in which the display driving pads and the touch pads are alternately arranged in groups, in the case that the OLED TDDI chip does not adopt the time division driving manner, the display driving signal provided by a group of display driving pads and the touch driving signal provided by an adjacent group of touch pads will interfere with each other, thereby affecting display effect and sensitivity of touch detection.

Figure 2:
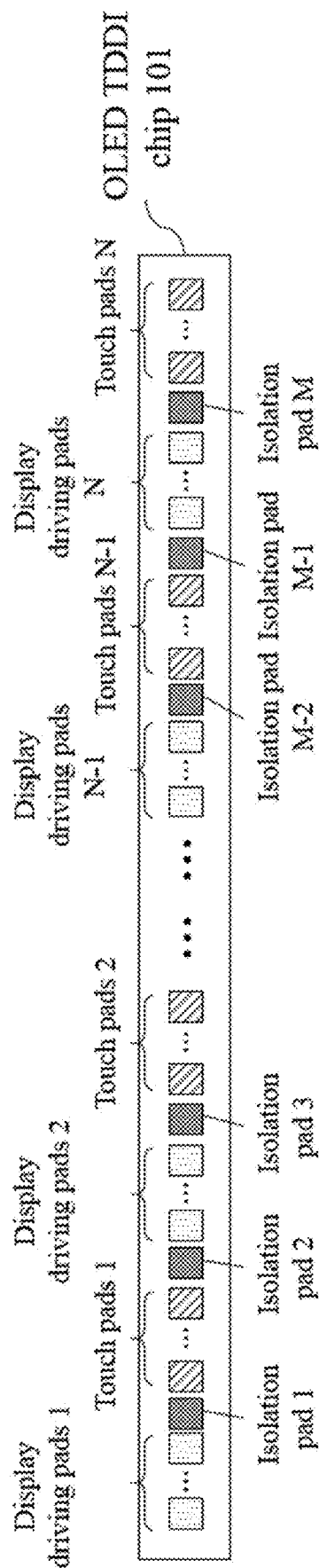
FIG. 2 shows a schematic diagram of a pad arrangement on an OLED TDDI chip according to an embodiment of the present disclosure.

FIG. 2 shows a schematic diagram of a pad arrangement on an OLED TDDI chip according to an embodiment of the present disclosure. As shown in FIG. 2, in order to reduce signal interference between a group of display driving pads and a group of touch pads that are adjacent, at least one group of isolation pads 1-M are added on the OLED TDDI chip 101, and each group of isolation pads is arranged between a group of display driving pads and a group of touch pads that are adjacent. It should be noted that, although it is shown in FIG. 1 that each group of isolation pads only includes one isolation pad, each group of isolation pads may also include more than one isolation pad, as will be described in detail below.

After adding the aforementioned isolation pads, some or all of the isolation pads may be further utilized to apply specific signals to their lead wires, so as to isolate signal interference between a group of display driving pads and a group of touch pads that are adjacent. The types of the specific signals and the position arrangement of the isolation pads will be further described below.

Figure 3:
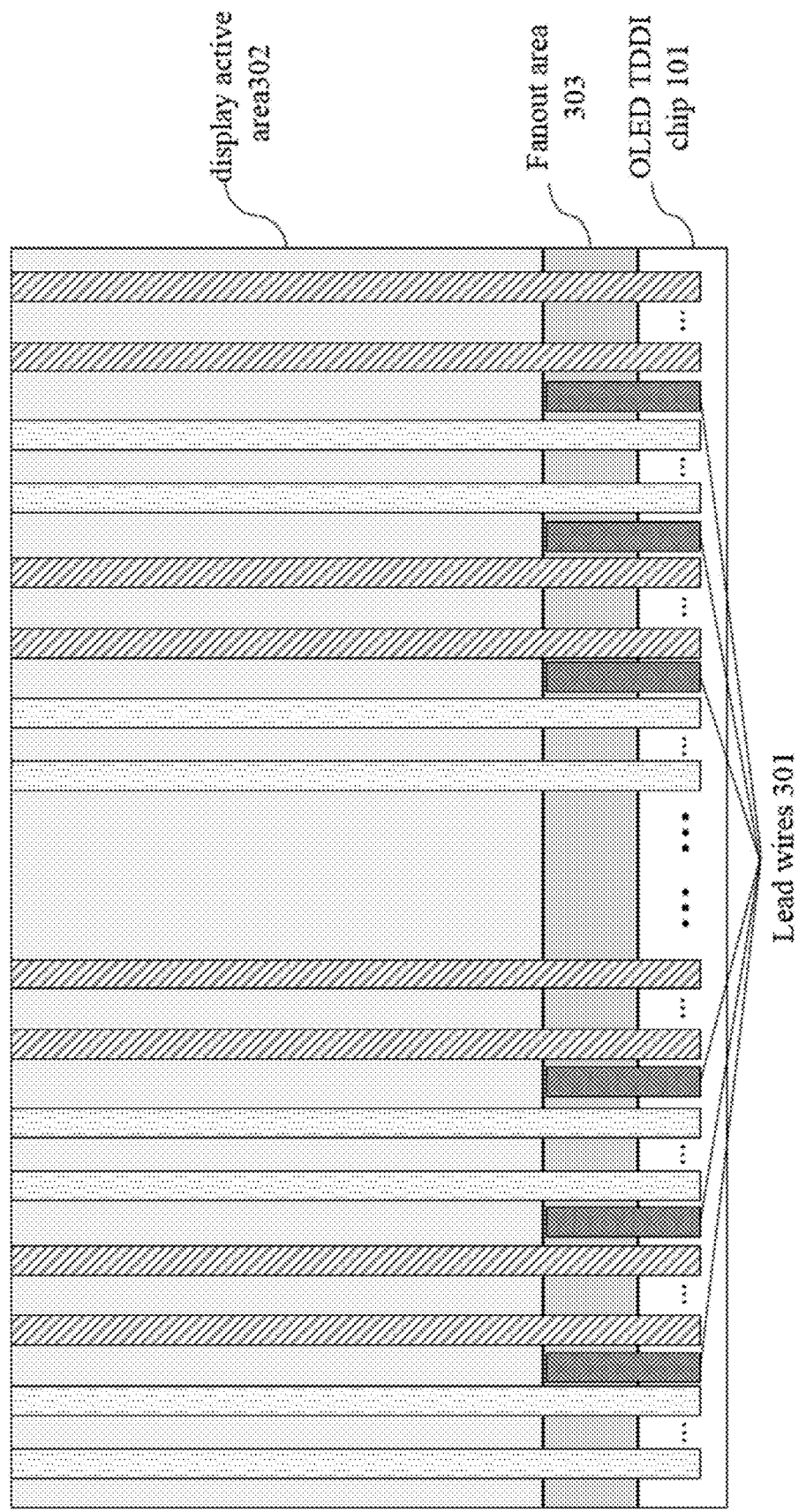
FIG. 3 shows a schematic diagram of an arrangement of the lead wires of the isolation pads according to an embodiment of the present disclosure.

An arrangement of the lead wires of the isolation pads according to an embodiment of the present disclosure will be described below in connection with FIG. 3. FIG. 3 shows a schematic diagram of an arrangement of the lead wires of the isolation pads according to an embodiment of the present disclosure. It should be noted that FIG. 3 is only an illustration, and is not intended to limit the line widths, spacing or tracing directions of the lead wires. In fact, the arrangement of the lead wires in the fanout area 303 may be fan-shaped.

Specifically, each isolation pad may be configured to be connected to one end of a lead wire, and the other end of the lead wire may extend toward the direction of the OLED touch display panel and not extend into the display active area (AA) of the OLED touch display panel. For example, as shown in FIG. 3, the other ends of lead wires 301 connecting to respective isolation pads may extend through a fanout area 303 to an edge of an display active area 302, but do not extend into the display active area 302. Therefore, by enabling the respective isolation pads to apply specific signals to their lead wires 301, not only interference that occurs on the OLED TDDI chip 101 can be reduced, but also interference that occurs on the fanout area 303 (that is, interference that occurs between a touch pad lead wire and a display driving pad lead wire that are adjacent) can be reduced. FIG. 3 may describe a packaging structure in which the OLED TDDI chip 101 is bonded with a substrate of the OLED touch display panel, such as COG (Chip on Glass) or COP (Chip on Plastic) packaging structure. In the above packaging structures, a lead wire 301 is a part of a fanout line in the fanout area 303. In another example of the packaging structure, in particular to the packaging structures in which the OLED TDDI chip 101 is bonded with the substrate of the OLED touch display panel through another substrate, such as COF (Chip On Film) packaging structure, a part of a lead wire 301 is in the fanout area 303, and the other part of the lead wire 301 is a wire (not shown) on the substrate in the COF packaging structure that connects a pad of the OLED TDDI chip 101 and an outer lead. In another example of the COF packaging structure, the other ends of the lead wires 301 may only extend to the edge of the fanout area 303 and not into the fanout area 303 (not shown), so as to meet specific tracing design requirements, which is not limited herein.

Next, the types of the specific signals applied by the isolation pads to isolate signal interference will be described. It should be noted that different isolation pads may be used to apply the same or different specific signals, or only a part of the isolation pads may be used to apply specific signals, while the other part of the isolation pads are in a floating state. However, in order to achieve a better interference reduction effect, it is preferable to use all the isolation pads to apply specific signals for isolating signal interference.

Specifically, a specific signal applied by an isolation pad may be one of: a ground signal, a signal with a fixed potential, and a signal with a preset voltage waveform.

In one example, in order to reduce interference caused by the display driving signals on the display driving pads, the signal with a preset voltage waveform may be a signal with at least one same signal characteristic and at least one different signal characteristic as a display driving signal, where the signal characteristic includes at least a part of frequency, phase, amplitude, slew rate, and DC offset.

Preferably, the signal with a preset voltage waveform may be a signal with a same frequency and a reverse phase as the display driving signal, so as to better cancel the interference caused by the display driving signal. In the case that the signal with a preset voltage waveform has a same frequency and a reverse phase as the display driving signal, the above two kinds of signals may further be the same in at least one signal characteristic, where the at least one signal characteristic may be at least one of amplitude, slew rate, and DC offset. Therefore, when the signal with a preset voltage waveform having a same frequency and a reverse phase as the display driving signal is closer to the display driving signal in other signal characteristic(s), the signal with a preset voltage waveform can perform better interference suppression effect, thereby reducing interference suffered by the touch pads adjacent to the isolation pad.

In this example, the signal with a preset voltage waveform may have a same frequency as the display driving signal, and the signal with a preset voltage waveform may also be different from the display driving signal in at least one signal characteristic, where the at least one signal characteristic may be at least one of phase, amplitude, slew rate, and DC offset. For example, the signal with a preset voltage waveform may be a signal with a same frequency but a not completely reverse phase (that is, the phase difference is not 180 degrees) as the display driving signal, and the phase difference between the signal with a preset voltage waveform and the display driving signal may be close to 180 degrees, thereby also providing corresponding interference suppression effect.

In another example, in order to reduce interference caused by the touch driving signals on the touch pads, the signal with a preset voltage waveform may be a signal with at least one same signal characteristic and at least one different signal characteristic as a touch driving signal, where the signal characteristic includes at least a part of frequency, phase, amplitude, slew rate, and DC offset.

Preferably, the signal with a preset voltage waveform may be a signal with a same frequency and a reverse phase as the touch driving signal, so as to better cancel the interference caused by the touch driving signal. In the case that the signal with a preset voltage waveform has a same frequency and a reverse phase as the touch driving signal, the above two kinds of signals may further be the same in at least one signal characteristic, where the at least one signal characteristic is at least one of amplitude, slew rate, and DC offset. Therefore, when the signal with a preset voltage waveform having a same frequency and a reverse phase as the touch driving signal is closer to the touch driving signal in other signal characteristic(s), the signal with a preset voltage waveform can perform better interference suppression effect, thereby reducing interference suffered by the display driving pads adjacent to the isolation pad.

In this example, the signal with a preset voltage waveform may have a same frequency as the touch driving signal, and the signal with a preset voltage waveform is also different from the touch driving signal in at least one signal characteristic, where the at least one signal characteristic is at least one of phase, amplitude, slew rate, and DC offset. For example, the signal with a preset voltage waveform may be a signal with a same frequency but a not completely reverse phase (that is, the phase difference is not 180 degrees) as the touch driving signal, and the phase difference between the signal with a preset voltage waveform and the touch driving signal may be close to 180 degrees, thereby also providing corresponding interference suppression effect.

Figure 4:
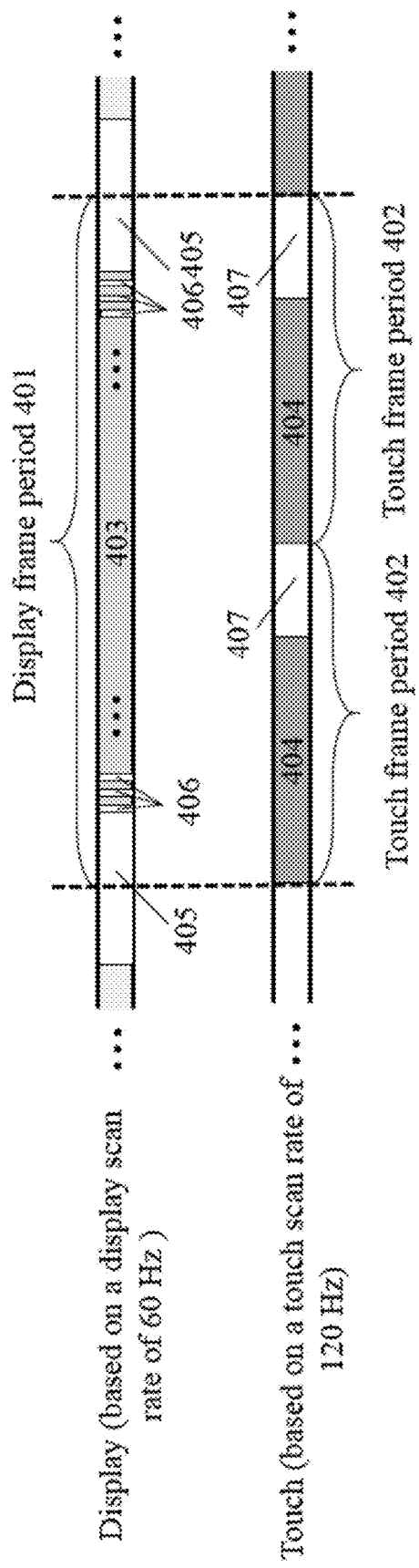
FIG. 4 shows a timing diagram of display and touch according to an embodiment of the present disclosure.

A period during which the signal with a preset voltage waveform is applied according to an embodiment of the present disclosure will be described below in connection with FIG. 4. FIG. 4 shows a timing diagram of display and touch according to an embodiment of the present disclosure.

Specifically, FIG. 4 schematically shows a display frame period 401 with a length of 16.6 ms and a touch frame period 402 with a length of 8.3 ms based on a display scan rate of 60 Hz and a touch scan rate of 120 Hz, where one display frame period 401 is equivalent to two touch frame periods 402. The display driving signals are provided during a display operation period 403 within each display frame period 401, and the touch driving signals are provided during a touch operation period 404 within each touch frame period 402. In addition, each display frame period 401 further includes a plurality of frame scan blanking periods (i.e., Vertical blanking periods) 405 and row scan blanking periods (i.e., Horizontal blanking periods) 406 during which the display driving signals are not provided, and each touch frame period 402 further includes a touch interval period 407 during which the touch driving signals are provided.

As shown in FIG. 4, the display operation period 403 and the touch operation period 404 are at least partially overlapped, and the isolation pad may be configured to apply the signal with a preset voltage waveform during an overlapped operation period in which the display operation period 403 and the touch operation period 404 are at least partially overlapped. That is, the isolation pad may be configured to apply the signal with a preset voltage waveform for reducing interference only during a period when interference between display and touch actually occurs (that is, the aforementioned overlapped operation period).

In a non-interference period during which the display driving signals are not provided or the touch driving signals are not provided, that is, the aforementioned frame scan blanking period 405, row scan blanking period 406, and touch interval period 407, the isolation pad may not apply the signal with a preset voltage waveform for reducing interference. Alternatively, in the non-interference period, the isolation pad may be used to reduce a large load on the data line or the touch electrodes caused by the coupling capacitance between the lead wires. Specifically, the isolation pad may be configured to apply a ground signal or to be in a floating state during at least one of the frame scan blanking periods, the row scan blanking periods and the touch interval period, so as to reduce the large load caused by the coupling capacitance, as will be further described in detail below.

Figure 5:
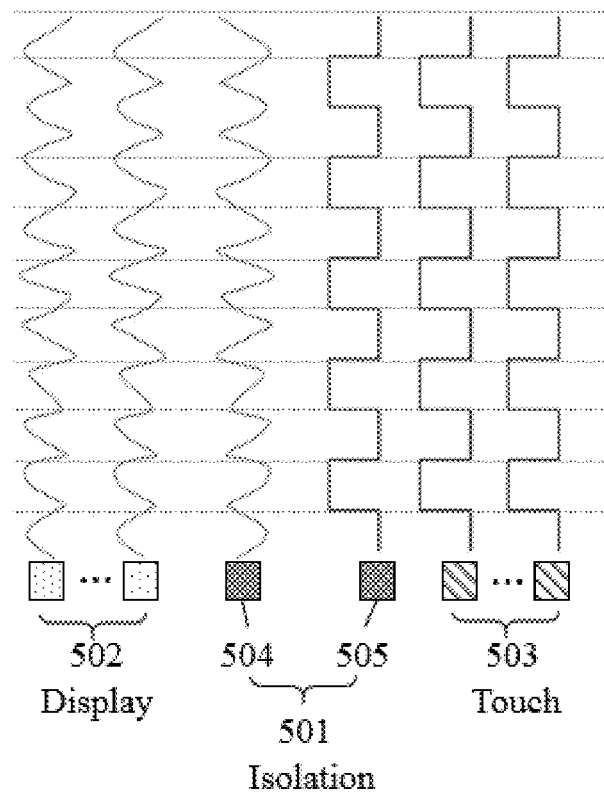
FIG. 5 shows a first example of a position arrangement of isolation pads and a signal with a preset voltage waveform according to an embodiment of the present disclosure.

Next, an example of a position arrangement of isolation pads and a signal with a preset voltage waveform according to an embodiment of the present disclosure will be described in connection with FIG. 5. FIG. 5 shows a first example of a position arrangement of isolation pads and a signal with a preset voltage waveform according to an embodiment of the present disclosure.

As shown in FIG. 5, a first group of isolation pads 501 are arranged between a first group of display driving pads 502 and a first group of touch pads 503 that are adjacent, which include a first isolation pad 504 and a second isolation pad 505. The first isolation pad 504 may be configured to apply a signal with a preset voltage waveform during the overlapped operation period, where the signal with a preset voltage waveform may be a signal with a same frequency and a reverse phase as a touch driving signal, or a signal with a same frequency and a reverse phase as a display driving signal of the first group of display driving pads 502. That is, the first isolation pad 504 may be configured to apply a signal with a same frequency and a reverse phase as the touch driving signal or the display driving signal, so as to reduce interference caused by the touch driving signal or the display driving signal. For example, FIG. 5 shows that the first isolation pad 504 is configured to apply a signal with a same frequency and a reverse phase as the display driving signal, so as to reduce the interference caused by the display driving signal. In the case where the first isolation pad 504 is configured to apply a signal with a same frequency and a reverse phase as the display driving signal of the first group of display driving pads 502, if different pads of the first group of display driving pads 502 have different display driving signals, the signal with a same frequency and a reverse phase may be applied according to the display driving signal on the display driving pad that is closest to the first isolation pad 504 in position.

In this example, since the second isolation pad 505 is arranged between the first group of touch pads 503 and the first isolation pad 504, the second isolation pad 505 may be configured to be floated or to apply a signal with a same frequency and a same phase as the touch driving signal during the touch operation period, so as to isolate a coupling capacitance between a lead wire of the first isolation pad 504 and an adjacent touch pad lead wire (i.e., one of the lead wires of the first group of touch pads 503 that is closest to the lead wire of the first isolation pad 504 in position). That is, the second isolation pad 505 may be used to reduce a large load on the touch electrodes caused by the coupling capacitance between the lead wire of the first isolation pad 504 and the adjacent touch pad lead wire, so as to protect the touch driving signal from influence of the signal on the lead wire of the first isolation pad 504, thereby improving touch sensitivity.

Figure 6:
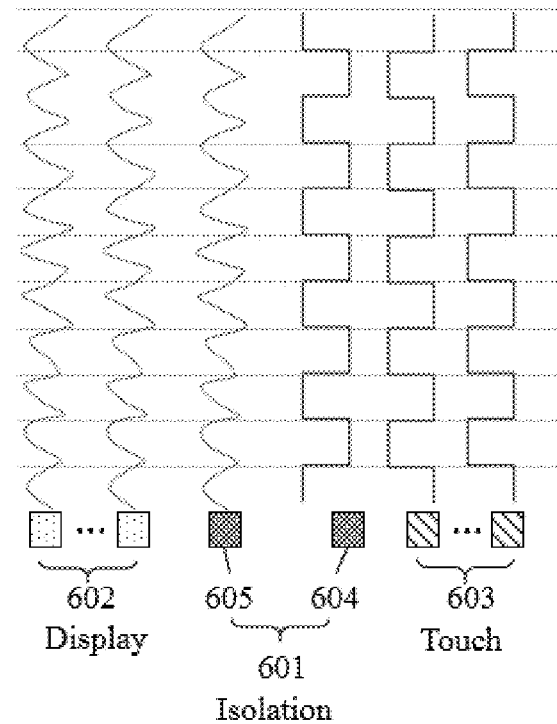
FIG. 6 shows a second example of a position arrangement of isolation pads and a signal with a preset voltage waveform according to an embodiment of the present disclosure.

FIG. 6 shows a second example of a position arrangement of isolation pads and a signal with a preset voltage waveform according to an embodiment of the present disclosure.

As shown in FIG. 6, a first group of isolation pads 601 are arranged between a first group of display driving pads 602 and a first group of touch pads 603 that are adjacent, which include a first isolation pad 604 and a second isolation pad 605. The first isolation pad 604 may be configured to apply a signal with a preset voltage waveform during the overlapped operation period, where the signal with a preset voltage waveform may be a signal with a same frequency and a reverse phase as the touch driving signal, or a signal with a same frequency and a reverse phase as the display driving signal of the first group of display driving pads 602. That is, the first isolation pad 604 may be configured to apply a signal with a same frequency and a reverse phase as the touch driving signal or the display driving signal, so as to reduce interference caused by the touch driving signal or the display driving signal. For example, FIG. 6 shows that the first isolation pad 604 is configured to apply a signal with a same frequency and a reverse phase as the touch driving signal, so as to reduce the interference caused by the touch driving signal. Similarly, in the case where the first isolation pad 604 is configured to apply the signal with a same frequency and a reverse phase as the display driving signal of the first group of display driving pads 602, if different pads of the first group of display driving pads 602 have different display driving signals, the signal with a same frequency and a reverse phase may be applied according to the display driving signal on the display driving pad that is closest to the first isolation pad 604 in position.

In this example, since the second isolation pad 605 is arranged between the first group of display driving pads 602 and the first isolation pad 604, the second isolation pad 605 may be configured to be floated or apply a signal with a same frequency and a same phase as the display driving signal of the first group of display driving pads 602 during the display operation period, so as to isolate the coupling capacitance between the lead wire of the first isolation pad 604 and an adjacent display driving pad lead wire (i.e., one of the lead wires of the first group of display driving pads 602 that is closest to the lead wire of the first isolation pad 604 in position). That is, the second isolation pad 605 may be used to reduce a large load on the data line caused by the coupling capacitance between the lead wire of the first isolation pad 604 and the adjacent display driving pad lead wire, so as to protect the display driving signal from influence of the signal on the lead wire of the first isolation pad 604, thereby improving display effect. Similarly, if different pads of the first group of display driving pads 602 have different display driving signals, the signal with a same frequency and a same phase may be applied according to the display driving signal on the display driving pad that is closest to the first isolation pad 604 in position.

As described above, in the above case where the signal with a preset voltage waveform is the signal with a same frequency and a reverse phase as the touch driving signal, the above signal with a preset voltage waveform may further be the same as the touch driving signal in at least one signal characteristic; and, in the above case where the signal with a preset voltage waveform is the signal with a same frequency and a reverse phase as the display driving signal of the first group of display driving pads 502 or 602, the above signal with the preset voltage waveform may further be the same as the display driving signal of the first group of display driving pads 502 or 602 in at least one signal characteristic, where the at least one signal characteristic is at least one of amplitude, slew rate, and DC offset. That is, when applying the signal with a same frequency and a reverse phase for interference reduction, the signal with a same frequency and a reverse phase may be made as the same as possible with the corresponding touch driving signal or display driving signal in other signal characteristic(s), so as to achieve better interference suppression effect.

In addition, as described above, each display frame period also includes the frame scanning blanking periods and the row scanning blanking periods during which the display driving signals are not provided, and each touch frame period also includes the touch interval period during which the touch driving signals are provided. Therefore, the first isolation pad 504 or 604 may be configured to apply the signal with a preset voltage waveform only during the overlapped operation period in which interference actually occurs so as to reduce interference, and configured to reduce load during the frame scan blanking periods, the row scan blanking periods and the touch interval period in which interference does not occur. Specifically, the first isolation pad 504 or 604 may be configured to apply a ground signal or be in a floating state during at least one of the frame scan blanking periods, the row scan blanking periods and the touch interval period, so as to reduce the large load on the data line or the touch electrodes caused by the coupling capacitance.

Figure 7:
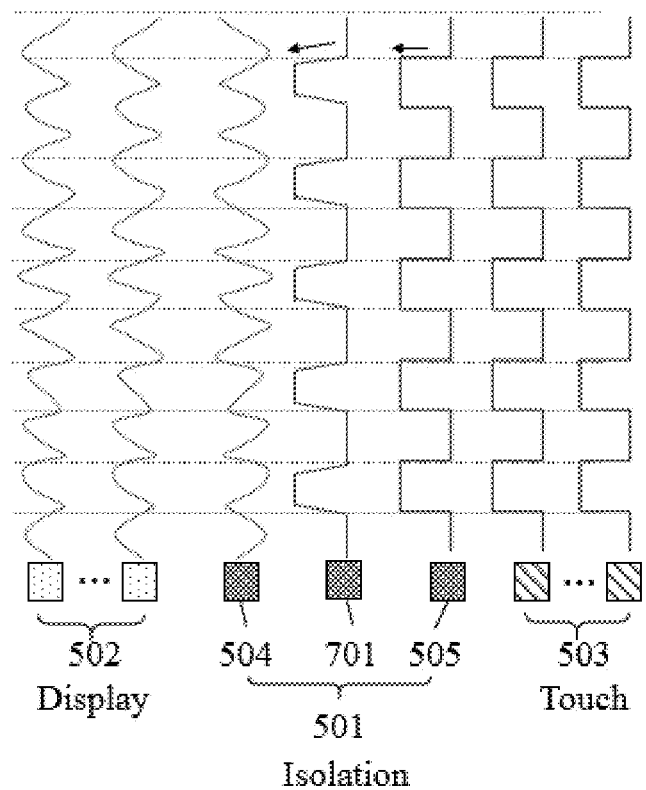
FIG. 7 shows a third example of a position arrangement of isolation pads and a signal with a preset voltage waveform according to an embodiment of the present disclosure.

FIG. 7 shows a third example of a position arrangement of isolation pads and a signal with a preset voltage waveform according to an embodiment of the present disclosure.

Compared with the first group of isolation pads 501 shown in FIG. 5 including the first isolation pad 504 and the second isolation pad 505, the first group of isolation pads 501 shown in FIG. 7 further includes a third isolation pad 701 arranged between the first isolation pad 504 and the second isolation pad 505. The third isolation pad 701 may be configured to drive an entire layer of isolation electrodes between a layer in the OLED display panel structure nearest to the touch electrodes (for example, the cathode of OLED) and the touch electrodes of the OLED touch display panel, so as to reduce load on the touch electrodes. Specifically, the third isolation pad 701 may be configured to provide, during the touch operation period, a loading free driving signal with a same frequency and a same phase as the touch driving signal to the isolation electrodes between the cathode of OLED and the touch electrodes of the OLED touch display panel. Taking a common on-cell OLED touch display panel as an example, the touch electrodes are disposed above the OLED display panel, and the cathode of OLED of the OLED display panel is closest to the touch electrodes. In another on-cell OLED touch display panel, it may be the anode of OLED that is closest to the touch electrodes. Therefore, in general, the aforementioned isolation electrodes may be an entire layer of electrodes between the OLED display panel and the on-cell touch electrodes. It should be noted that, due to a large load of the entire layer of isolation electrodes, the slew rate of the loading free driving signal may be changed, resulting in different slew rates between the loading free driving signal and the touch driving signal (as shown by the arrows in FIG. 7), that is, making the loading free driving signal and the touch driving signal actually not completely the same in phase. Therefore, in this example, the third isolation pad 701 is not directly adjacent to the first group of touch pads 503, but is directly adjacent to the second isolation pad 505, and the second isolation pad 505 may be configured to apply a signal with a same frequency and a same phase as the touch driving signal during the touch operation period, so as to isolate the coupling capacitance between the lead wire of the third isolation pad 701 and an adjacent touch pad lead wire. Alternatively, in another example, the first isolation pad 504 in FIG. 7 close to the display driving pads may be configured to apply a signal with a same frequency and a reverse phase (or close to a reverse phase) as the touch driving signal to reduce interference caused by the touch driving signal.

Next, examples of methods for bonding an OLED TDDI chip with an OLED touch display panel according to the embodiments of the present disclosure will be described in connection with FIGS. 8-10. Description of elements not related to the present disclosure is omitted below and in the drawings to avoid confusion.

Specifically, an OLED touch display apparatus according to an embodiment of the present disclosure may include the aforementioned OLED touch and display driver integration chip and an OLED touch display panel coupled with the OLED touch and display driver integration chip. At least one lead wire is provided on a substrate of the OLED touch display panel, and the at least one group of isolation pads on the OLED touch and display driver integration chip are connected to one end of the at least one lead wire. As described above, the other end of the lead wire may extend toward the direction of the OLED touch display panel and does not extend into the display active area of the OLED touch display panel. The OLED touch and display driver integration chip may be bonded with the OLED touch display panel by using any one of COG (Chip on Glass), COP (Chip on Plastic) and COF (Chip On Flex or Chip On Film) packaging structures, and the configuration of the lead wires will be described below in connection with a specific packaging structure.

Figure 8:
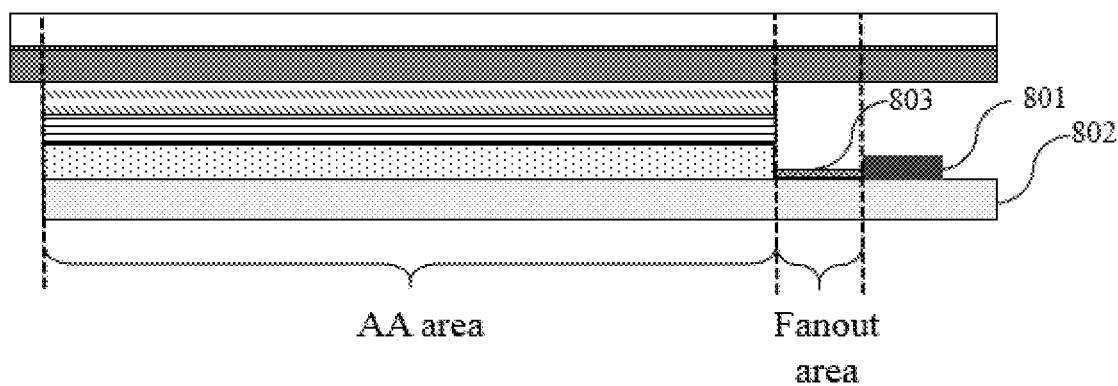
FIG. 8 shows a schematic diagram of an OLED TDDI chip being bonded with an OLED touch display panel by using a COG packaging structure according to an embodiment of the present disclosure.

FIG. 8 shows a schematic diagram of an OLED TDDI chip being bonded with an OLED touch display panel by using a COG packaging structure according to an embodiment of the present disclosure. As shown in FIG. 8, an OLED TDDI chip 801 is arranged on a substrate 802 of an OLED touch display panel, and at least one group of isolation pads on the OLED TDDI chip 801 may be directly connected to one end of at least one lead wire 803 arranged on the substrate 802. In an example, as shown in FIG. 8, the other end of the at least one lead wire 803 extends through the fanout area to the edge of the display active area (simply referred to as AA area) of the OLED touch display panel and does not extend into the AA area. In another example, the at least one lead wire 803 may also extend into the AA area, and in this case, the at least one lead wire 803 and touch sensing lines may be located on a same metal layer.

Figure 9:
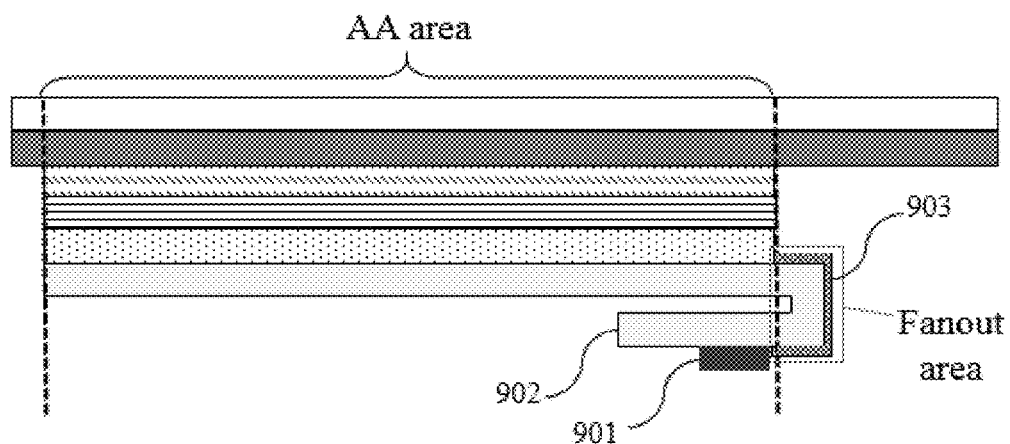
FIG. 9 shows a schematic diagram of an OLED TDDI chip being bonded with an OLED touch display panel by using a COP packaging structure according to an embodiment of the present disclosure.

FIG. 9 shows a schematic diagram of an OLED TDDI chip being bonded with an OLED touch display panel by using a COP packaging structure according to an embodiment of the present disclosure. As shown in FIG. 9, an OLED TDDI chip 901 is arranged on a substrate 902 of an OLED touch display panel, and at least one group of isolation pads on the OLED TDDI chip 901 may be directly connected to one end of at least one lead wire 903 arranged on the substrate 902. In an example, as shown in FIG. 9, the other end of the at least one lead wire 903 extends through the fanout area to the edge of the AA area of the OLED touch display panel and does not extend into the AA area. In another example, the at least one lead wire 903 may also extend into the AA area, and in this case, the at least one lead wire 903 and touch sensing lines may be located on a same metal layer.

Figure 10:
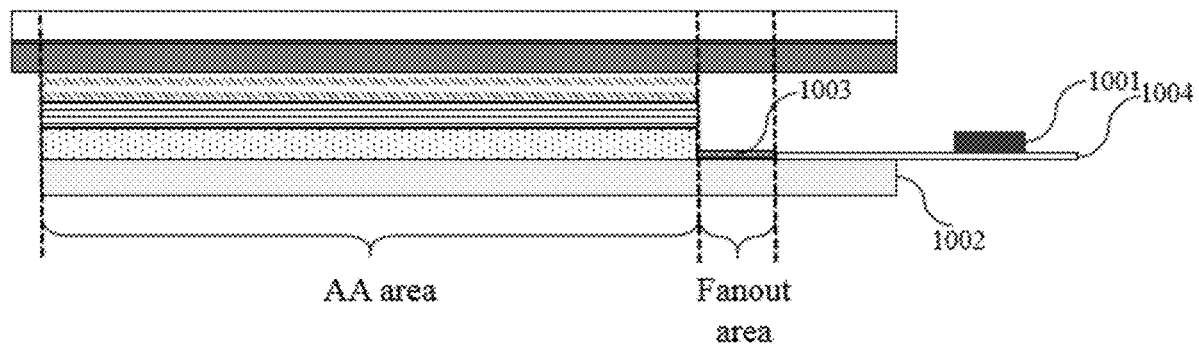
FIG. 10 shows a schematic diagram of an OLED TDDI chip being bonded with an OLED touch display panel by using a COF packaging structure according to an embodiment of the present disclosure.

FIG. 10 shows a schematic diagram of an OLED TDDI chip being bonded with an OLED touch display panel by using a COF packaging structure according to an embodiment of the present disclosure. Unlike the COG and COP packaging structures in which the TDDI chip is directly arranged on the substrate of the OLED touch display panel, in the COF packaging structure, an OLED TDDI chip 1001 is packaged on a Flexible Printed Circuit (FPC) 1004, as shown in FIG. 10. Therefore, at least one group of isolation pads of the OLED TDDI chip 1001 are directly connected to at least one additional lead wire (not shown) on the FPC 1004. In this case, the at least one group of isolation pads of the OLED TDDI chip 1001 may be connected to at least one lead wire 1003 on a substrate 1002 via the at least one additional lead wire, so as to be bonded with the substrate 1002. In another example, in order to meet specific tracing design requirements, the at least one lead wire 1003 may not be provided on the substrate 1002, but only at least one lead wire on the FPC 1004 is used as the lead wire of the at least one group of isolation pads, and in this case, the at least one lead wire of the isolation pads only extend to the edge of the fanout area and does not extend into the fan-out area.

Therefore, the OLED touch and display driver integration chip and the OLED touch display apparatus including the chip according to the embodiments of the present disclosure may reduce interference between a group of display driving pads and a group of touch pads that are adjacent, and furthermore, may further reduce load of the data lines of the OLED touch display panel to which the group of display driving pads are coupled, or load of the touch electrodes on the OLED touch display panel to which the group of touch pads are coupled, thereby achieving better display effect and touch sensitivity.

Next, a pad arrangement of an OLED TDDI chip for load reduction according to the embodiments of the present disclosure will be introduced. It should be noted that since the pad arrangement for load reduction is substantially the same in position as the pad arrangement for interference reduction as described above, the pad arrangement for load reduction will be described specifically in connection with the same drawings as mentioned above.

According to the embodiments of the present disclosure, under the current architecture in which display driving pads and touch pads are alternately arranged in groups on an OLED TDDI chip, by adding an isolation pad between a group of display driving pads and a group of touch pads that are adjacent, and using the isolation pad to apply a specific signal to a lead wire to which it is connected, or making the isolation pad to be in a floating state, load of data lines of the OLED touch display panel to which the group of display driving pads are coupled, or load of touch electrodes on the OLED touch display panel to which the group of touch pads are coupled may be reduced.

FIG. 1 shows a schematic diagram of a pad arrangement on an OLED TDDI chip in the prior art. As shown in FIG. 1, an OLED TDDI chip 101 includes at least one group of display driving pads 1-N and at least one group of touch pads 1-N that are alternately arranged in groups. Each display driving pad may be coupled to a data line on the OLED touch display panel, and provide a display driving signal to a capacitor of a corresponding display pixel via the data line to charge the capacitor, thereby driving the OLED to emit light. Each touch pad may provide a touch driving signal to touch electrodes on the OLED touch display panel.

As shown in FIG. 1, due to the architecture in which the display driving pads and the touch pads are alternately arranged in groups, there is a large coupling capacitance between a touch pad lead wire and an adjacent display driving pad lead wire in the fanout area, which leads to a large load in corresponding touch electrodes and data line, and thus affect display effect and sensitivity of touch detection.

FIG. 2 shows a schematic diagram of a pad arrangement on an OLED TDDI chip according to an embodiment of the present disclosure. As shown in FIG. 2, in order to reduce load of data lines of the OLED touch display panel to which a group of display driving pads are coupled, or load of touch electrodes on the OLED touch display panel to which a group of touch pads are coupled, at least one group of isolation pads 1-M are added on the OLED TDDI chip 101, and each group of isolation pads is arranged between a group of display driving pads and a group of touch pads that are adjacent. It should be noted that, although it is shown in FIG. 1 that each group of isolation pads only includes one isolation pad, each group of isolation pads may also include more than one isolation pad, as will be described in detail below.

After adding the aforementioned isolation pads, some or all of the isolation pads may be further utilized to apply specific signals to their lead wires, or may be in a floating state, so as to isolate the coupling capacitance between a touch pad lead wire and an adjacent displaying driving pad lead wire, thereby reducing the load on corresponding touch electrodes or data lines. The types of the specific signals and a position arrangement of isolation pads will be further described below.

An arrangement of the lead wires of the isolation pads according to an embodiment of the present disclosure will be described below in connection with FIG. 3. FIG. 3 shows a schematic diagram of an arrangement of the lead wires of the isolation pads according to an embodiment of the present disclosure. It should be noted that FIG. 3 is only an illustration, and is not intended to limit the line widths, spacing or tracing directions of the lead wires. In fact, the arrangement of the lead wires in the fanout area 303 may be fan-shaped.

Specifically, each isolation pad may be configured to be connected to one end of a lead wire, and the other end of the lead wire may extend toward the direction of the OLED touch display panel and not extend into the display active area of the OLED touch display panel. For example, as shown in FIG. 3, the other ends of lead wires 301 connecting to respective isolation pads may extend to an edge of the display active area 302 through a fanout area 303, but does not extend into the display active area 302. Therefore, by enabling the respective isolation pads to apply specific signals to their lead wires 301 or setting the isolation pads in a floating state, the coupling capacitance between a touch pad lead wire and an adjacent displaying driving pad lead wires in the fanout area 303 may be isolated. FIG. 3 may describe a packaging structure in which the OLED TDDI chip 101 is bonded with a substrate of the OLED touch display panel, such as COG (Chip on Glass) or COP (Chip on Plastic) packaging structure. In the above packaging structures, a lead wire 301 is a part of a fanout line in the fanout area 303. In another example of the packaging structure, in particular to the packaging structures in which the OLED TDDI chip 101 is bonded with the substrate of the OLED touch display panel through another substrate, such as COF (Chip On Film) packaging structure, a part of a lead wire 301 is in the fanout area 303, and the other part of the lead wire 301 is a wire (not shown) on the substrate in the COF packaging structure that connects a pad of the OLED TDDI chip 101 and an outer lead. In another example of the COF packaging structure, the other ends of the lead wires 301 may only extend to the edge of the fanout area 303 and not into the fanout area 303 (not shown), so as to meet specific tracing design requirements, which is not limited herein.

Next, the types of the specific signals applied by the isolation pads for load reduction will be described. It should be noted that different isolation pads may be used to apply the same or different specific signals, or only a part of the isolation pads may be used to apply the specific signals, while the other part of the isolation pads are set in a floating state. However, in order to achieve a better load reduction effect, it is preferable to enable an isolation pad to apply a signal with a same frequency and a same phase as a display driving signal and a touch driving signal, or set the isolation pad in a floating state.

Specifically, a specific signal applied by an isolation pad may be one of: a ground signal, a signal with a fixed potential, and a signal with a preset voltage waveform.

In one example, in order to reduce load of data lines to which a group of display driving pads are coupled, the signal with a preset voltage waveform may be a signal with at least one same signal characteristic as a display driving signal, where the signal characteristic includes at least a part of frequency, phase, amplitude, slew rate, and DC offset.

Preferably, the signal with a preset voltage waveform may be a signal with a same frequency and a same phase as the display driving signal, so as to better achieve the effect of load reduction. In the case that the signal with a preset voltage waveform has a same frequency and a same phase as the display driving signal, the above two kinds of signals may further be the same in at least one signal characteristic, where the at least one signal characteristic is at least one of amplitude, slew rate, and DC offset. Therefore, when the signal with a preset voltage waveform having a same frequency and a same phase as the display driving signal is closer to the display driving signal in other signal characteristic(s), the signal with a preset voltage waveform can perform better load reduction effect.

In this example, the signal with a preset voltage waveform may have a same frequency as the display driving signal, and the signal with a preset voltage waveform is also different from the display driving signal in at least one signal characteristic, where the at least one signal characteristic is at least one of phase, amplitude, slew rate, and DC offset. For example, the signal with a preset voltage waveform may be a signal with a same frequency but a not completely same phase as the display driving signal, and the phase difference between the signal with a preset voltage waveform and the display driving signal may be close to 0 degree, which can also provide corresponding load reduction effect.

In another example, in order to reduce load of data lines to which a group of touch pads are coupled, the signal with a preset voltage waveform may be a signal with at least one same signal characteristic as the touch driving signal, where the signal characteristic includes at least a part of frequency, phase, amplitude, slew rate, and DC offset.

Preferably, the signal with a preset voltage waveform may be a signal with a same frequency and a same phase as the touch driving signal, so as to better achieve the effect of load reduction. In the case that the signal with a preset voltage waveform has a same frequency and a same phase as the touch driving signal, the above two kinds of signals may further be the same in at least one signal characteristic, where the at least one signal characteristic is at least one of amplitude, slew rate, and DC offset. Therefore, when the signal with a preset voltage waveform having a same frequency and a same phase as the touch driving signal is closer to the touch driving signal in other signal characteristic(s), the signal with a preset voltage waveform can perform better load reduction effect.

In this example, the signal with a preset voltage waveform may have a same frequency as the touch driving signal, and the signal with a preset voltage waveform is also different from the touch driving signal in at least one signal characteristic, where the at least one signal characteristic is at least one of phase, amplitude, slew rate, and DC offset. For example, the signal with a preset voltage waveform may be a signal with a same frequency but a not completely same phase as the touch driving signal, and the phase difference between the signal with a preset voltage waveform and the touch driving signal may be close to 0 degree, which can also provide corresponding load reduction effect.

A period during which the signal with a preset voltage waveform is applied according to an embodiment of the present disclosure will be described below in connection with FIG. 4. FIG. 4 shows a timing diagram of display and touch according to an embodiment of the present disclosure.

Specifically, FIG. 4 schematically shows a display frame period 401 with a length of 16.6 ms and a touch frame period 402 with a length of 8.3 ms based on a display scan rate of 60 Hz and a touch scan rate of 120 Hz, where one display frame period 401 is equivalent to two a touch frame period 402. The display driving signals are provided during a display operation period 403 within each display frame period 401, and the touch driving signals are provided during a touch operation period 404 within each touch frame period 402, where the display operation period 403 is at least partially overlapped with the touch operation period 404. In addition, each display frame period 401 further includes a plurality of frame scan blanking periods (V blanking periods) 405 and row scan blanking periods (H blanking periods) 406 during which the display driving signals are not provided, and each touch frame period 402 further includes a touch interval period 407 during which the touch driving signals are provided.

The isolation pad may be configured to apply the signal with a preset voltage waveform during the display operation period 403 or during the touch operation period 404. For example, the isolation pad may be configured to apply a signal with a same frequency and a same phase as a display driving signal during the display operation period 403, or the isolation pad may be configured to apply a signal with a same frequency and a same phase as a touch driving signal during the touch operation period 404. That is, the isolation pad may be configured to apply the signal with a preset voltage waveform for reducing load of data lines or touch electrodes only during a period where there are display driving signals or touch driving signals.

Figure 11:
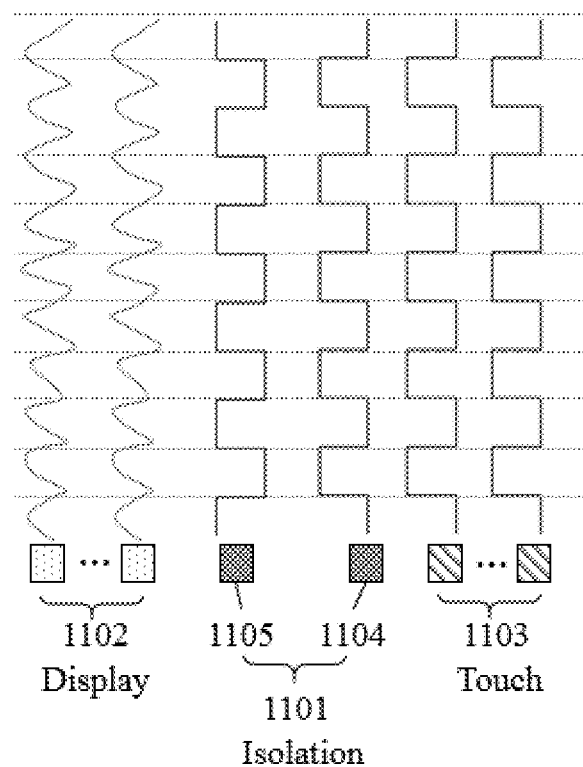
FIG. 11 shows a fourth example of a position arrangement of isolation pads and a signal with a preset voltage waveform according to an embodiment of the present disclosure.

Next, an example of a position arrangement of isolation pads and a signal with a preset voltage waveform according to an embodiment of the present disclosure will be described in connection with FIG. 11. FIG. 11 shows a fourth example of a position arrangement of isolation pads and a signal with a preset voltage waveform according to an embodiment of the present disclosure.

As shown in FIG. 11, a first group of isolation pads 1101 are arranged between a first group of display driving pads 1102 and a first group of touch pads 1103 that are adjacent, which includes a first isolation pad 1104 and a second isolation pad 1105. In this example, the first isolation pad 1104 may be configured to be floated or to apply a signal with a preset voltage waveform during the touch operation period, where the signal with a preset voltage waveform may be a signal with a same frequency and a same phase as the touch driving signal. That is, the first isolation pad 1104 may be configured to be in a floating state or to apply a signal with a same frequency and a same phase as the touch driving signal, so as to reduce load of touch electrodes to which the first group of touch pads 1103 are coupled, thereby improving touch sensitivity.

In this example, the second isolation pad 1105 is arranged between the first group of display driving pads 1102 and the first isolation pad 1104, and may be configured to apply, during the overlapped operation period, a signal with a same frequency and a reverse phase as the touch driving signal, or a signal with a same frequency and a reverse phase as the display driving signal of the first group of display driving pads 1102. That is, the second isolation pad 1105 may be configured to apply a signal with a same frequency and a reverse phase as the touch driving signal or the display driving signal, so as to reduce interference caused by the touch driving signal or the display driving signal. For example, FIG. 11 shows that the second isolation pad 1105 is configured to apply a signal with a same frequency and a reverse phase as the touch driving signal, so as to reduce the interference caused by the touch driving signal. In the case where the second isolation pad 1105 is configured to apply a signal with a same frequency and a reverse phase as the display driving signal of the first group of display driving pads 1102, if different pads of the first group of display driving pads 1102 have different display driving signals, the signal with a same frequency and a reverse phase may be applied according to the display driving signal on the display driving pad of the first group of display driving pads 1102 that is closest to the second isolation pad 1105 in position.

Figure 12:
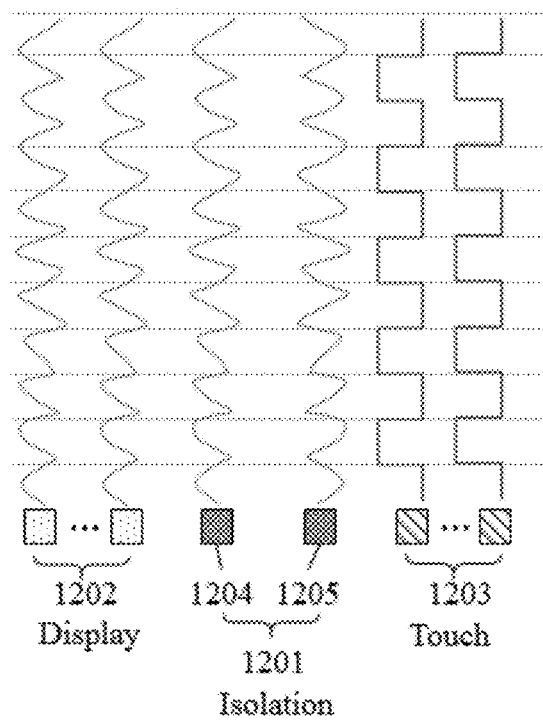
FIG. 12 shows a fifth example of a position arrangement of isolation pads and a signal with a preset voltage waveform according to an embodiment of the present disclosure.

FIG. 12 shows a fifth example of a position arrangement of isolation pads and a signal with a preset voltage waveform according to an embodiment of the present disclosure.

As shown in FIG. 12, a first group of isolation pads 1201 are arranged between a first group of display driving pads 1202 and a first group of touch pads 1203 that are adjacent, which includes a first isolation pad 1204 and a second isolation pad 1205. In this example, the first isolation pad 1204 may be configured to be floated or to apply the signal with a preset voltage waveform during the display operation period, where the signal with a preset voltage waveform may be a signal with a same frequency and a same phase as the display driving signal of the first group of display driving pads 1202. That is, the first isolation pad 1204 may be configured in a floating state or to apply a signal with a same frequency and a same phase as the display driving signal, so as to reduce load of data lines to which the first group of display driving pads 1202 are coupled, thereby improving display effect. If different pads of the first group of display driving pads 1202 have different display driving signals, the signal with a same frequency and a same phase may be applied according to the display driving signal on the display driving pad of the first group of display driving pads 1202 that is closest to the first isolation pad 1204 in position.

In this example, the second isolation pad 1205 is arranged between the first group of touch pads 1202 and the first isolation pad 1204, and may be configured to apply, during the overlapped operation period, a signal with a same frequency and a reverse phase as the touch driving signal, or a signal with a same frequency and a reverse phase as the display driving signal of the first group of display driving pads 1202. That is, the second isolation pad 1205 may be configured to apply a signal with a same frequency and a reverse phase as the touch driving signal or the display driving signal, so as to reduce interference caused by the touch driving signal or the display driving signal. For example, FIG. 12 shows that the second isolation pad 1205 is configured to apply a signal with a same frequency and a reverse phase as the display driving signal of the first group of display driving pads 1202, so as to reduce the interference caused by the display driving signal. Similarly, in the case where the second isolation pad 1205 is configured to apply a signal with a same frequency and a reverse phase as the display driving signal of the first group of display driving pads 1202, if different pads of the first group of display driving pads 1202 have different display driving signals, the signal with a same frequency and a reverse phase may be applied according to the display driving signal on the display driving pad of the group of display driving pads 1202 that is closest to the second isolation pad 1205 in position.

As described above, in the above case where the signal with a preset voltage waveform is a signal with a same frequency and a same phase as the touch driving signal, the above signal with a preset voltage waveform may further be the same as the touch driving signal in at least one signal characteristic; and, in the above case where the signal with a preset voltage waveform is a signal with a same frequency and a same phase as the display driving signal of the first group of display driving pads, the above signal with the preset voltage waveform may further be the same as the display driving signal of the first group of display driving pads in at least one signal characteristic, where the at least one signal characteristic is at least one of amplitude, slew rate, and DC offset. That is, when applying the signal with a same frequency and a same phase for load reduction, the signal with a same frequency and a same phase may be made as the same as possible with the corresponding touch driving signal or display driving signal in other signal characteristic(s), so as to achieve better load reduction effect.

Figure 13:
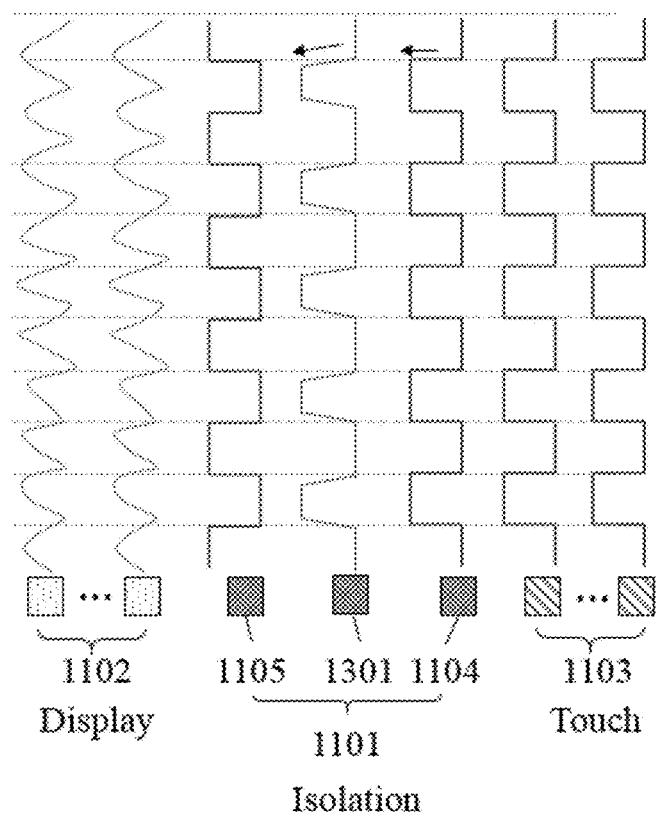
FIG. 13 shows a sixth example of a position arrangement of isolation pads and a signal with a preset voltage waveform according to an embodiment of the present disclosure.

FIG. 13 shows a sixth example of a position arrangement of isolation pads and a signal with a preset voltage waveform according to an embodiment of the present disclosure.

Compared with the first group of isolation pads 1101 shown in FIG. 11 including the first isolation pad 1104 and the second isolation pad 1105, the first group of isolation pads 1101 shown in FIG. 13 further includes a third isolation pad 1301 arranged between the first isolation pad 1104 and the second isolation pad 1105. The third isolation pad 1301 may be configured to drive an entire layer of isolation electrodes between a layer in the OLED display panel structure nearest to the touch electrodes (for example, the cathode of OLED) and the touch electrodes of the OLED touch display panel, so as to reduce load on the touch electrodes. Specifically, the third isolation pad 1301 may be configured to provide, during the touch operation period, a loading free driving signal with a same frequency and a same phase as the touch driving signal to the isolation electrodes between the cathode of OLED and the touch electrodes of the OLED touch display panel. Taking a common on-cell OLED touch display panel as an example, touch electrodes are disposed above an OLED display panel, and the cathode of OLED of the OLED display panel is closest to the touch electrodes. In another on-cell OLED touch display panel, it may be anodes of the OLED that is closest to the touch electrodes. Therefore, in general, the aforementioned isolation electrodes may be an entire layer of electrodes between an OLED display panel and on-cell touch electrodes.

It should be noted that, due to a large load of the entire layer of isolation electrodes, the slew rate of the loading free driving signal may be changed, resulting in different slew rates between the loading free driving signal and the touch driving signal (as shown by the arrows in FIG. 13), that is, making the loading free driving signal and the touch driving signal actually not completely the same in phase. Therefore, in this example, the third isolation pad 1301 is not directly adjacent to the first group of touch pads 1103, but is directly adjacent to the first isolation pad 1104, and the first isolation pad 1104 may be configured to apply a signal with a same frequency and a same phase as the touch driving signal during the touch operation period, so as to isolate a coupling capacitance between a lead wire of the third isolation pad 1301 and an adjacent touch pad lead wire. Alternatively, in another example, the second isolation pad 1105 in FIG. 13 close to the display driving pads may be configured to apply a signal with a same frequency and a reverse phase (or close to a reverse phase) as the touch driving signal to reduce interference caused by the touch driving signal.

An OLED touch display apparatus according to an embodiment of the present disclosure may include the aforementioned OLED touch and display driver integration chip and an OLED touch display panel coupled with the OLED touch and display driver integration chip. At least one lead wire is provided on a substrate of the OLED touch display panel, and at least one group of isolation pads on the OLED touch and display driver integration chip are connected to one end of the at least one lead wire. As described above, the other end of the lead wire may extend toward the direction of the OLED touch display panel and does not extend into the AA area of the OLED touch display panel. The OLED touch and display driver integration chip may be bonded with the OLED touch display panel by using any one of the COG, COP and COF packaging structures. Examples of the OLED touch and display driver integration chip being bonded with an OLED touch display panel by using one of the COG, COP and COF packaging structures have been described above in connection with FIGS. 8-10, which will not be repeatedly described herein.

Therefore, the OLED touch and display driver integration chip and the OLED touch display apparatus including the chip according to the embodiments of the present disclosure may reduce load of data lines of the OLED touch display panel to which a group of display driving pads are coupled, or load of touch electrodes on the OLED touch display panel to which a group of touch pads are coupled, and may further reduce interference between a group of display driving pads and a group of touch pads that are adjacent, thereby achieving better display effect and touch sensitivity.

Although the present disclosure has been disclosed in the above embodiments, they are not intended to limit the present disclosure. Anyone with ordinary knowledge in the relevant technical field can make some changes and modifications without departing from the spirit and scope of the present disclosure. Therefore, the protection scope of the present disclosure shall be subject to those defined by the appended claims.

What is claimed is:

1. An OLED touch and display driver integration chip for driving an OLED touch display panel, the OLED touch and display driver integration chip comprising:
    at least one group of display driving pads for providing display driving signals to the OLED touch display panel;
    at least one group of touch pads for providing touch driving signals to touch electrodes on the OLED touch display panel, and alternately arranged in groups with the at least one group of display driving pads; and
    at least one group of isolation pads, wherein each group of isolation pads includes at least one isolation pad and is arranged between a group of display driving pads and a group of touch pads that are adjacent, and an isolation pad of the at least one group of isolation pads is configured to apply a specific signal to isolate signal interference between the group of display driving pads and the group of touch pads that are adjacent.

2. The OLED touch and display driver integration chip of claim 1, wherein the isolation pads are configured to connect to one ends of lead wires,
    the other ends of the lead wires extend toward a direction of the OLED touch display panel and does not extend into a display active area of the OLED touch display panel, or
    the other ends of the lead wires extend to an edge of a fanout area of the OLED touch display panel and does not extend into the fanout area.

3. The OLED touch and display driver integration chip of claim 1, wherein the specific signal is one of: a ground signal, a signal with a fixed potential, and a signal with a preset voltage waveform.

4. The OLED touch and display driver integration chip of claim 3, wherein the signal with a preset voltage waveform is a signal with at least one same signal characteristic and at least one different signal characteristic as a display driving signal,
    wherein the signal characteristic includes at least a part of frequency, phase, amplitude, slew rate and DC offset.

5. The OLED touch and display driver integration chip of claim 4, wherein the signal with a preset voltage waveform has a same frequency and a reverse phase as the display driving signal.

6. The OLED touch and display driver integration chip of claim 4, wherein the signal with a preset voltage waveform has a same frequency and a reverse phase as the display driving signal, and the signal with a preset voltage waveform is further the same as the display driving signal in at least one signal characteristic, wherein the at least one signal characteristic is at least one of amplitude, slew rate, and DC offset.

7. The OLED touch and display driver integration chip of claim 4, wherein the signal with a preset voltage waveform has a same frequency as the display driving signal, and the signal with a preset voltage waveform is further different from the display driving signal in at least one signal characteristic, wherein the at least one signal characteristic is at least one of phase, amplitude, slew rate and DC offset.

8. The OLED touch and display driver integration chip of claim 3, wherein the signal with a preset voltage waveform is a signal with at least one same signal characteristic and at least one different signal characteristic as a touch driving signal,
    wherein the signal characteristic includes at least a part of frequency, phase, amplitude, slew rate and DC offset.

9. The OLED touch and display driver integration chip of claim 8, wherein the signal with a preset voltage waveform has a same frequency and a reverse phase as the touch driving signal.

10. The OLED touch and display driver integration chip of claim 8, wherein the signal with a preset voltage waveform has a same frequency and a reverse phase as the touch driving signal, and the signal with a preset voltage waveform is further the same as the touch driving signal in at least one signal characteristic, wherein the at least one signal characteristic is at least one of amplitude, slew rate, and DC offset.

11. The OLED touch and display driver integration chip of claim 8, wherein the signal with a preset voltage waveform has a same frequency as the touch driving signal, and the signal with a preset voltage waveform is further different from the touch driving signal in at least one signal characteristic, wherein the at least one signal characteristic is at least one of phase, amplitude, slew rate and DC offset.

12. The OLED touch and display driver integration chip of claim 3, wherein,
the display driving signals are provided during a display operation period within each of a plurality of display frame periods, and the touch driving signals are provided during a touch operation period within each of a plurality of touch frame periods, wherein the display operation period and the touch operation period are at least partially overlapped, and,
at least one isolation pad of the at least one group of isolation pads is configured to apply the signal with a preset voltage waveform during an overlapped operation period in which the display operation period and the touch operation period are at least partially overlapped.

13. The OLED touch and display driver integration chip of claim 12, wherein,
each display frame period further includes frame scan blanking periods and row scan blanking periods in which the display driving signals are not provided, and each touch frame period further includes a touch interval period in which the touch driving signals are not provided,
wherein the at least one isolation pad is further configured to apply the ground signal or be in a floating state during at least one of the frame scan blanking periods, the row scan blanking periods and the touch interval period.

14. The OLED touch and display driver integration chip of claim 12, wherein the at least one group of isolation pads includes a first group of isolation pads arranged between a first group of display driving pads and a first group of touch pads that are adjacent, and,
the first group of isolation pads includes:
a first isolation pad configured to apply the signal with a preset voltage waveform during the overlapped operation period, wherein the signal with a preset voltage waveform is a signal with a same frequency and a reverse phase as a touch driving signal, or a signal with a same frequency and a reverse phase as a display driving signal of the first group of display driving pads; and
a second isolation pad arranged between the first group of touch pads and the first isolation pad, and configured to be floated or apply a signal with a same frequency and a same phase as the touch driving signal during the touch operation period.

15. The OLED touch and display driver integration chip of claim 12, wherein the at least one group of isolation pads includes a first group of isolation pads arranged between a first group of display driving pads and a first group of touch pads that are adjacent, and,
the first group of isolation pads includes:
a first isolation pad configured to apply the signal with a preset voltage waveform during the overlapped operation period, wherein the signal with a preset voltage waveform is a signal with a same frequency and a reverse phase as a touch driving signal, or a signal with a same frequency and a reverse phase as a display driving signal of the first group of display driving pads; and
a second isolation pad arranged between the first group of display driving pads and the first isolation pad, and configured to be floated or apply a signal with a same frequency and a same phase as the display driving signal of the first group of display driving pads during the display operation period.

16. The OLED touch and display driver integration chip of claim 15, wherein,
in the case that the signal with a preset voltage waveform is a signal with a same frequency and a reverse phase as the touch driving signal, the signal with a preset voltage waveform is further the same as the touch driving signal in at least one signal characteristic, and,
in the case that the signal with a preset voltage waveform is a signal with a same frequency and a reverse phase as the display driving signal of the first group of display driving pads, the signal with a preset voltage waveform is further the same as the display driving signal of the first group of display driving pads in at least one signal characteristic,
wherein the at least one signal characteristic is at least one of amplitude, slew rate and DC offset.

17. The OLED touch and display driver integration chip of claim 15, wherein,
each display frame period further includes frame scan blanking periods and row scan blanking periods in which the display driving signals are not provided, and each touch frame period further includes a touch interval period in which the touch driving signals are not provided,
wherein the at least one isolation pad is further configured to apply the ground signal or be in a floating state during at least one of the frame scan blanking periods, the row scan blanking periods and the touch interval period.

18. The OLED touch and display driver integration chip of claim 14, wherein the first group of isolation pads further includes:
a third isolation pad arranged between the first isolation pad and the second isolation pad, and configured to provide a loading free driving signal to isolation electrodes between cathode and the touch electrodes of the OLED touch display panel during the touch operation period,
wherein the loading free driving signal provided by the third isolation pad has a same frequency and a same phase as the touch driving signal.

19. The OLED touch and display driver integration chip of claim 18, wherein the loading free driving signal has a different slew rate as the touch driving signal.

20. An OLED touch display apparatus, comprising:
the OLED touch and display driver integration chip of claim 1; and
an OLED touch display panel coupled with the OLED touch and display driver integration chip.

21. The OLED touch display apparatus of claim 20, wherein at least one lead wire is arranged on a substrate of the OLED touch display panel, and the at least one group of isolation pads on the OLED touch and display driver integration chip are connected to one end of the at least one lead wire.

22. The OLED touch display apparatus of claim 21, wherein the OLED touch and display driver integration chip is bonded with the OLED touch display panel by using a COG or COP packaging structure, and the at least one group of isolation pads on the OLED touch and display driver integration chip are directly connected to the at least one lead wire.

23. The OLED touch display apparatus of claim 21, wherein the OLED touch and display driver integration chip is bonded with the OLED touch display panel by using a COF packaging structure, and the at least one group of isolation pads on the OLED touch and display driver integration chip are connected to the at least one lead wire via at least one additional lead wire on a FPC on which the OLED touch and display driver integration chip is packaged.

24. The OLED touch display apparatus of claim 23, wherein the at least one lead wire extends to an edge of a display active area of the OLED touch display panel and does not extend into the display active area.

25. The OLED touch display apparatus of claim 20, wherein the OLED touch and display driver integration chip is bonded with the OLED touch display panel by using a COF packaging structure, and the at least one group of isolation pads on the OLED touch and display driver integration chip are directly connected to at least one lead wire on a FPC on which the OLED touch and display driver integration chip is packaged, and the at least one lead wire extends to an edge of a fanout area of the OLED touch display panel and does not extend into the fanout area.

26. An OLED touch and display driver integration chip for driving an OLED touch display panel, the OLED touch and display driver integration chip comprising:
   at least one group of display driving pads for providing display driving signals to the OLED touch display panel;
   at least one group of touch pads for providing touch driving signals to touch electrodes on the OLED touch display panel, and alternately arranged in groups with the at least one group of display driving pads; and
   at least one group of isolation pads, wherein each group of isolation pads includes at least one isolation pad and is arranged between a group of display driving pads and a group of touch pads that are adjacent, and an isolation pad of the at least one group of isolation pads is configured to apply a specific signal or be in a floating state, to reduce load of data lines of the OLED touch display panel to which the group of display driving pads are coupled, or load of the touch electrodes on the OLED touch display panel to which the group of touch pads are coupled.

27. The OLED touch and display driver integration chip of claim 26, wherein the isolation pads are configured to connect to one ends of lead wires,
   the other ends of the lead wires extend toward a direction of the OLED touch display panel and does not extend into a display active area of the OLED touch display panel, or
   the other ends of the lead wires extend to an edge of a fanout area of the OLED touch display panel and does not extend into the fanout area.

28. The OLED touch and display driver integration chip of claim 26, wherein the specific signal is one of: a ground signal, a signal with a fixed potential, and a signal with a preset voltage waveform.

29. The OLED touch and display driver integration chip of claim 28, wherein the signal with a preset voltage waveform is a signal with at least one same signal characteristic as a display driving signal,
   wherein the signal characteristic includes at least a part of frequency, phase, amplitude, slew rate and DC offset.

30. The OLED touch and display driver integration chip of claim 29, wherein the signal with a preset voltage waveform has a same frequency and a same phase as the display driving signal.

31. The OLED touch and display driver integration chip of claim 29, wherein the signal with a preset voltage waveform has a same frequency and a same phase as the display driving signal, and the signal with a preset voltage waveform is further the same as the display driving signal in at least one signal characteristic, wherein the at least one signal characteristic is at least one of amplitude, slew rate, and DC offset.

32. The OLED touch and display driver integration chip of claim 29, wherein the signal with a preset voltage waveform has a same frequency as the display driving signal, and the signal with a preset voltage waveform is further different from the display driving signal in at least one signal characteristic, wherein the at least one signal characteristic is at least one of phase, amplitude, slew rate and DC offset.

33. The OLED touch and display driver integration chip of claim 28, wherein the signal with a preset voltage waveform is a signal with at least one same signal characteristic as a touch driving signal,
   wherein the signal characteristic includes at least a part of frequency, phase, amplitude, slew rate and DC offset.

34. The OLED touch and display driver integration chip of claim 33, wherein the signal with a preset voltage waveform has a same frequency and a same phase as the touch driving signal.

35. The OLED touch and display driver integration chip of claim 33, wherein the signal with a preset voltage waveform has a same frequency and a same phase as the touch driving signal, and the signal with a preset voltage waveform is further the same as the touch driving signal in at least one signal characteristic, wherein the at least one signal characteristic is at least one of amplitude, slew rate, and DC offset.

36. The OLED touch and display driver integration chip of claim 33, wherein the signal with a preset voltage waveform has a same frequency as the touch driving signal, and the signal with a preset voltage waveform is further different from the touch driving signal in at least one signal characteristic, wherein the at least one signal characteristic is at least one of phase, amplitude, slew rate and DC offset.

37. The OLED touch and display driver integration chip of claim 28, wherein,
   the display driving signals are provided during a display operation period within each of a plurality of display frame periods, and the touch driving signals are provided during a touch operation period within each of a plurality of touch frame periods, wherein the display operation period and the touch operation period are at least partially overlapped, and,
   at least one isolation pad of the at least one group of isolation pads is configured to apply the signal with a preset voltage waveform during the display operation period or the touch operation period.

38. The OLED touch and display driver integration chip of claim 37, wherein the at least one group of isolation pads includes a first group of isolation pads arranged between a first group of display driving pads and a first group of touch pads that are adjacent, and,
   the first group of isolation pads includes:
   a first isolation pad configured to be floated or apply the signal with a preset voltage waveform during the touch operation period, wherein the signal with a preset voltage waveform is a signal with a same frequency and a same phase as a touch driving signal; and a second isolation pad arranged between the first group of display driving pads and the first isolation pad, and configured to apply, during an overlapped operation period in which the display operation period and the touch operation period are at least partially overlapped, a signal with a same frequency and a reverse phase as a touch driving signal, or a signal with a same frequency and a reverse phase as a display driving signal of the first group of display driving pads.

39. The OLED touch and display driver integration chip of claim 37, wherein the at least one group of isolation pads includes a first group of isolation pads arranged between a first group of display driving pads and a first group of touch pads that are adjacent, and, the first group of isolation pads includes:
a first isolation pad configured to be floated or apply the signal with a preset voltage waveform during the display operation period, wherein the signal with a preset voltage waveform is a signal with a same frequency and a same phase as a display driving signal of the first group of display driving pads; and a second isolation pad arranged between the first group of touch pads and the first isolation pad, and configured to apply, during an overlapped operation period in which the display operation period and the touch operation period are at least partially overlapped, a signal with a same frequency and a reverse phase as a touch driving signal or a signal with a same frequency and a reverse phase as the display driving signal of the first group of display driving pads.

40. The OLED touch and display driver integration chip of claim 39, wherein, in the case that the signal with a preset voltage waveform is a signal with a same frequency and a same phase as the touch driving signal, the signal with a preset voltage waveform is further the same as the touch driving signal in at least one signal characteristic, and, in the case that the signal with a preset voltage waveform is a signal with a same frequency and a same phase as the display driving signal of the first group of display driving pads, the signal with a preset voltage waveform is further the same as the display driving signal of the first group of display driving pads in at least one signal characteristic, wherein the at least one signal characteristic is at least one of amplitude, slew rate and DC offset.

41. The OLED touch and display driver integration chip of claim 39, wherein the first group of isolation pads further includes:

a third isolation pad arranged between the first isolation pad and the second isolation pad, and configured to provide a loading free driving signal to isolation electrodes between cathode and the touch electrodes of the OLED touch display panel during the touch operation period, wherein the loading free driving signal provided by the third isolation pad has a same frequency and a same phase as the touch driving signal.

42. The OLED touch and display driver integration chip of claim 41, wherein the loading free driving signal has a different slew rate as the touch driving signal.

43. An OLED touch display apparatus, comprising:
the OLED touch and display driver integration chip of claim 26; and
an OLED touch display panel coupled with the OLED touch and display driver integration chip.

44. The OLED touch display apparatus of claim 43, wherein at least one lead wire is arranged on a substrate of the OLED touch display panel, and the at least one group of isolation pads on the OLED touch and display driver integration chip are connected to one end of the at least one lead wire.

45. The OLED touch display apparatus of claim 44, wherein the OLED touch and display driver integration chip is bonded with the OLED touch display panel by using a COG or COP packaging structure, and the at least one group of isolation pads on the OLED touch and display driver integration chip are directly connected to the at least one lead wire.

46. The OLED touch display apparatus of claim 44, wherein the OLED touch and display driver integration chip is bonded with the OLED touch display panel by using a COF packaging structure, and the at least one group of isolation pads on the OLED touch and display driver integration chip are connected to the at least one lead wire via at least one additional lead wire on a FPC on which the OLED touch and display driver integration chip is packaged.

47. The OLED touch display apparatus of claim 46, wherein the at least one lead wire extends to an edge of a display active area of the OLED touch display panel and does not extend into the display active area.

48. The OLED touch display apparatus of claim 43, wherein the OLED touch and display driver integration chip is bonded with the OLED touch display panel by using a COF packaging structure, and the at least one group of isolation pads on the OLED touch and display driver integration chip are directly connected to at least one lead wire on a FPC on which the OLED touch and display driver integration chip is packaged, and the at least one lead wire extends to an edge of a fanout area of the OLED touch display panel and does not extend into the fanout area.

* * * * *